(12) United States Patent
Kudelka

(10) Patent No.: US 6,566,273 B2
(45) Date of Patent: May 20, 2003

(54) ETCH SELECTIVITY INVERSION FOR ETCHING ALONG CRYSTALLOGRAPHIC DIRECTIONS IN SILICON

(75) Inventor: Stephan Kudelka, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/893,157

(22) Filed: Jun. 27, 2001

(65) Prior Publication Data

US 2003/0003759 A1 Jan. 2, 2003

(51) Int. Cl.⁷ .................. H01L 21/302; H01L 21/461
(52) U.S. Cl. ............................. 438/733; 438/445
(58) Field of Search .................... 438/443, 445, 438/504, 733

(56) References Cited

U.S. PATENT DOCUMENTS 6,150,670 A * 11/2000 Faltermeier et al. .......... 257/77
6,362,040 B1 * 3/2002 Tews et al. ................. 438/246

* cited by examiner

Primary Examiner—Amir Zarabian
Assistant Examiner—Pamela Perkins

(57) ABSTRACT

Methods for expanding trenches are disclosed. A trench is formed in a substrate having side walls including at least two crystallographic planes. One crystallographic plane is etchable at a faster rate than a second crystallographic plane. A dielectric layer is selectively grown on surfaces of the crystallographic planes such that the dielectric layer includes a greater thickness on one of the crystallographic plane than on the other. The dielectric layer and the substrate are etched such that an etch rate inversion is achieved. That is, the second crystallographic plane is effectively etched at a faster rate than the first crystallographic plane.

22 Claims, 15 Drawing Sheets

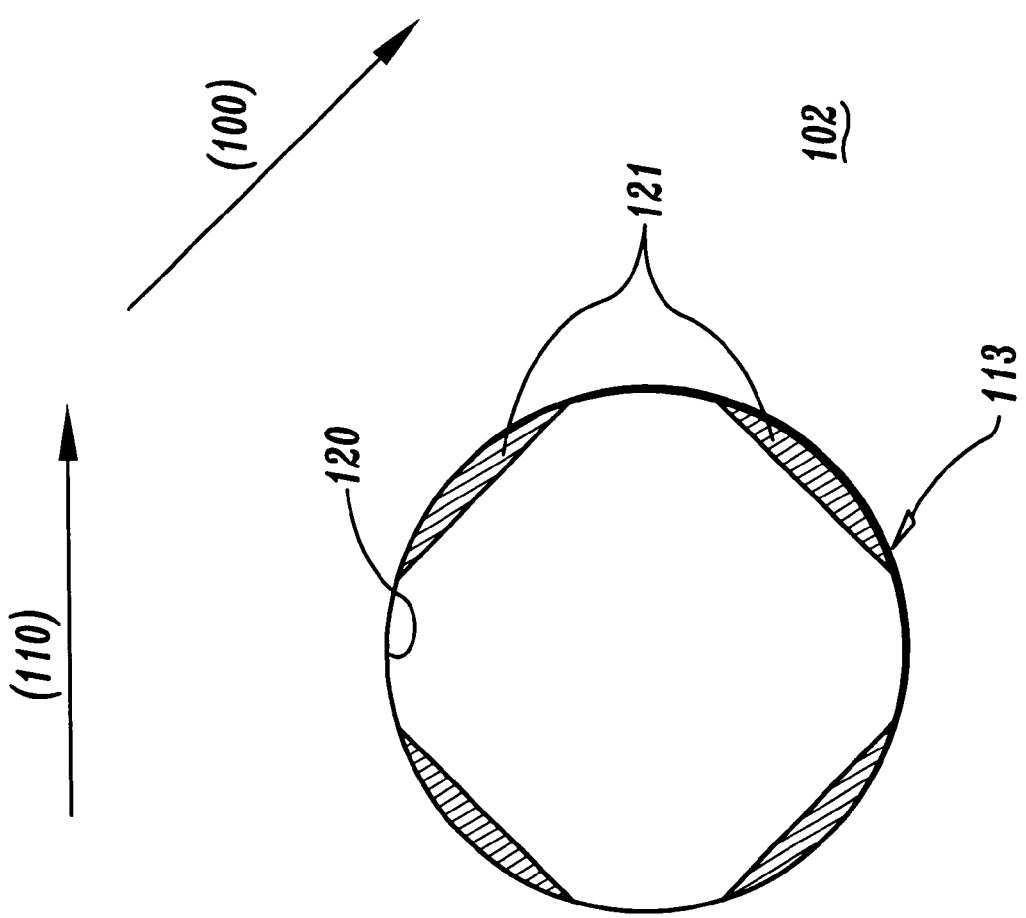

ETCH SELECTIVITY INVERSION FOR ETCHING ALONG CRYSTALLOGRAPHIC DIRECTIONS IN SILICON

BACKGROUND

1. Technical Field

This disclosure relates to semiconductor fabrication, and more particularly, to methods for adjusting etch selectivity between crystallographic planes or directions in silicon.

2. Description of the Related Art

The extendability of deep trench based memory devices is limited by the storage capacitance of the deep trench as the ground rules shrink. Since the capacitance that can be stored in the deep trench is a linear function of the surface area of the deep trench, the formation of a larger trench is beneficial. However, widening a deep trench has a large impact on layout area of a semiconductor chip.

Attempts have been made to increase the surface area of a deep trench below an insulating collar, which is formed within the deep trench. The region below the insulating collar is not as limited in available area as an upper portion of the deep trench. To expand the region below the collar, an isotropic silicon reactive ion etch (RIE) process can be employed. The RIE process recesses a silicon substrate below the insulating collar to provide increased surface area. The RIE process suffers from many disadvantages. These disadvantages include:

1. Low selectivity to oxide. With the reactive ion etch process the insulating collar is also etched thereby reducing the thickness of the insulating collar. The insulating collar is, for example, a LOCOS oxide or a deposited oxide. When this oxide is thinned vertical leakage currents may occur.
2. Expensive process. The RIE tools are expensive and have a low throughput due to the need for single wafer processing.
3. Collateral damage. The RIE process leaves polymer deposits in etched areas which may have a detrimental effect on component performance. The RIE process may cause surface damage to etched areas and undesirable side pockets may be formed in etched areas.

As a result, alternate etching techniques have been employed. These etching techniques attempt to etch bottle shaped trenches by etching a silicon substrate selective to the collar oxide. These etching techniques often provide etching rates, which etch one crystallographic plane of a silicon substrate faster than another crystallographic plane. In a semiconductor memory fabrication process, this may lead to asymmetric shaped bottle-shaped portions of deep trenches. As dimensions for semiconductor devices shrink, any asymmetries may cause overlap between trenches or force a semiconductor device layout to increase in area to accommodate the need for spacings between trenches.

Therefore, a need exists for an improved method for increasing surface area of deep trench capacitors. A further need exists for a method, which symmetrically forms bottle-shaped trench portions to increase the surface area of deep trench capacitors without causing overlap between adjacent trenches and without the disadvantages of reactive ion etching.

SUMMARY OF THE INVENTION

Methods for expanding trenches are disclosed. A trench is formed in a substrate having side walls including at least two crystallographic planes. One crystallographic plane is etchable at a faster rate than a second crystallographic plane. A dielectric layer is selectively grown on surfaces of the crystallographic planes such that the dielectric layer includes a greater thickness on one of the crystallographic plane than on the other. The dielectric layer and the substrate are etched such that an etch rate inversion is achieved. That is, the second crystallographic plane is effectively etched at a faster rate than the first crystallographic plane.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 9 is a cross-sectional view of the semiconductor device of FIG. 8A showing the selective oxide etched in accordance with the present invention;

DETAILED DESCRIPTION OF PREFERRED EMBODIMENTS

The present invention provides methods for increasing the surface area of trenches formed in a semiconductor substrate by providing a wet etch process, which includes a selective deposition to adjust etch selectivity. In one embodiment of the present invention, deep trenches are formed in a monocrystalline silicon substrate. To expand the trenches, a wet etch process is employed. A wet etchant, such as a base (e.g., pH>7) solution is employed to expand the trench. The wet etch process etches different crystallographic directions of the silicon at different rates, however, by first performing a selective oxide deposition. The selectivity of the wet etch can be adjusted to symmetrically expand the trench in all directions.

The present invention includes a basic (pH greater than 7) chemistry wet etch, which may be performed in a batch tank process. The present invention also preferably creates a rectangular or, preferably, a square shaped deep trench, which provides increased surface area as compared to the RIE process which forms round trenches. The present invention will now be illustratively described in detail in terms of deep trenches. It is to be understood that deep trench technology is but one application of the present invention. The present invention may be employed with other structures formed in silicon substrates, for example shallow trenches for shallow trench isolation (STI) structures.

Figure 1:
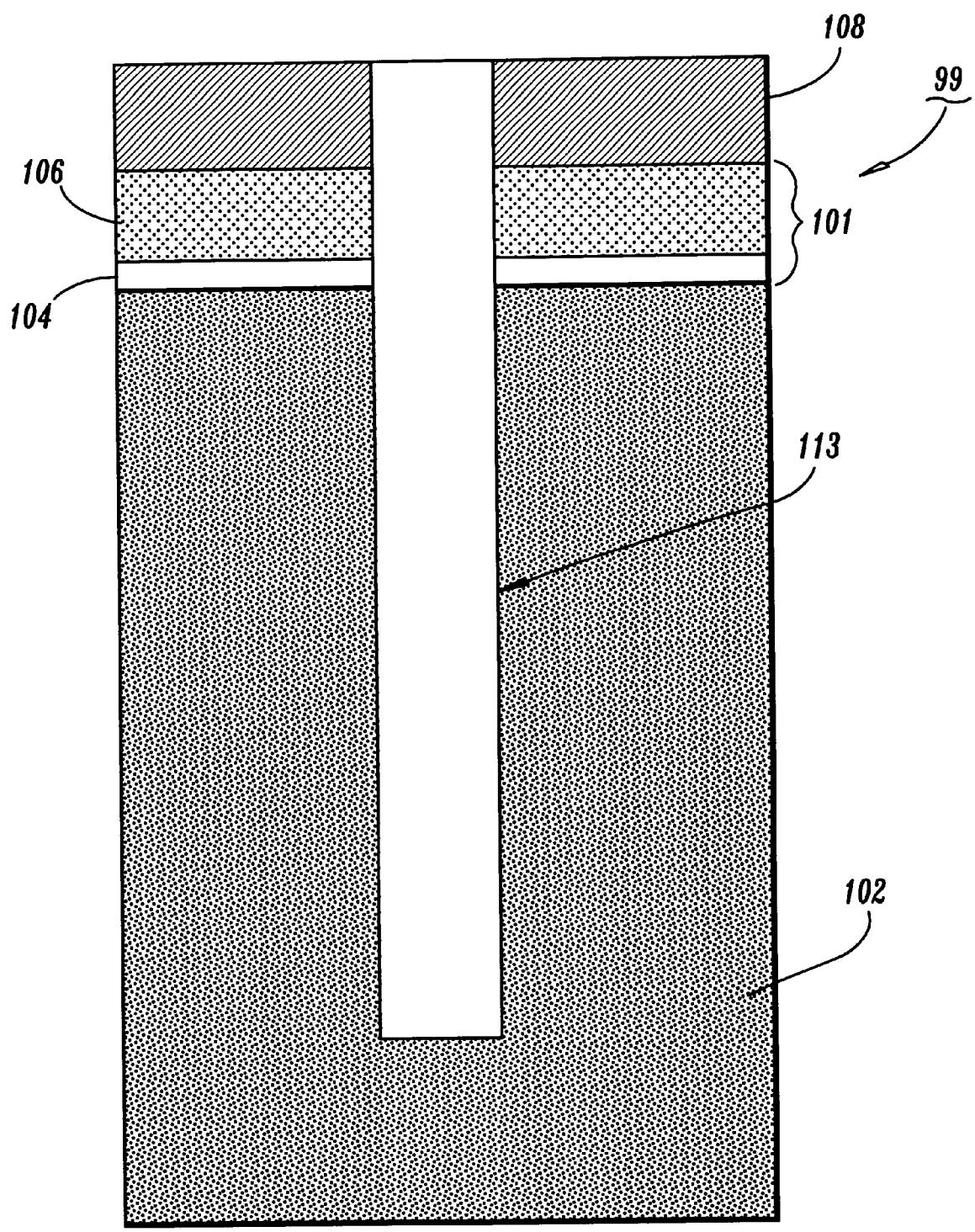
FIG. 1 is a cross-sectional view of a semiconductor device having a trench formed in a substrate in accordance with the present invention.

Referring now in specific detail to the drawings in which like reference numerals identify similar or identical elements throughout the several views, and initially to FIG. 1, a memory device 99 includes a substrate 102 having a pad stack 101 formed thereon. Memory device 99 may include a dynamic random access memory (DRAM), synchronous DRAM, static RAMs, and read only memories or other integrated circuits. Substrate 102 is preferably a monocrystalline silicon substrate, however other substrates may be employed, for example, a silicon-on-insulator substrate. Pad stack 101 may include various layers of materials used to further process memory device 99. In a preferred embodiment, pad stack 101 includes an oxide layer 104 and a nitride layer 106.

A hard mask layer 108 is deposited on pad stack 101. Hard mask 108 is patterned using lithographic techniques known to those skilled in the art. For example, a resist layer may be deposited on hardmask layer 108, exposed and developed to open up holes at locations where trenches 113 will be formed. Formation of trench 113 is preferably formed by employing an anisotropic etch, such as a reactive ion etch (RIE). Trench 113 is etched into substrate 102.

Figure 2:
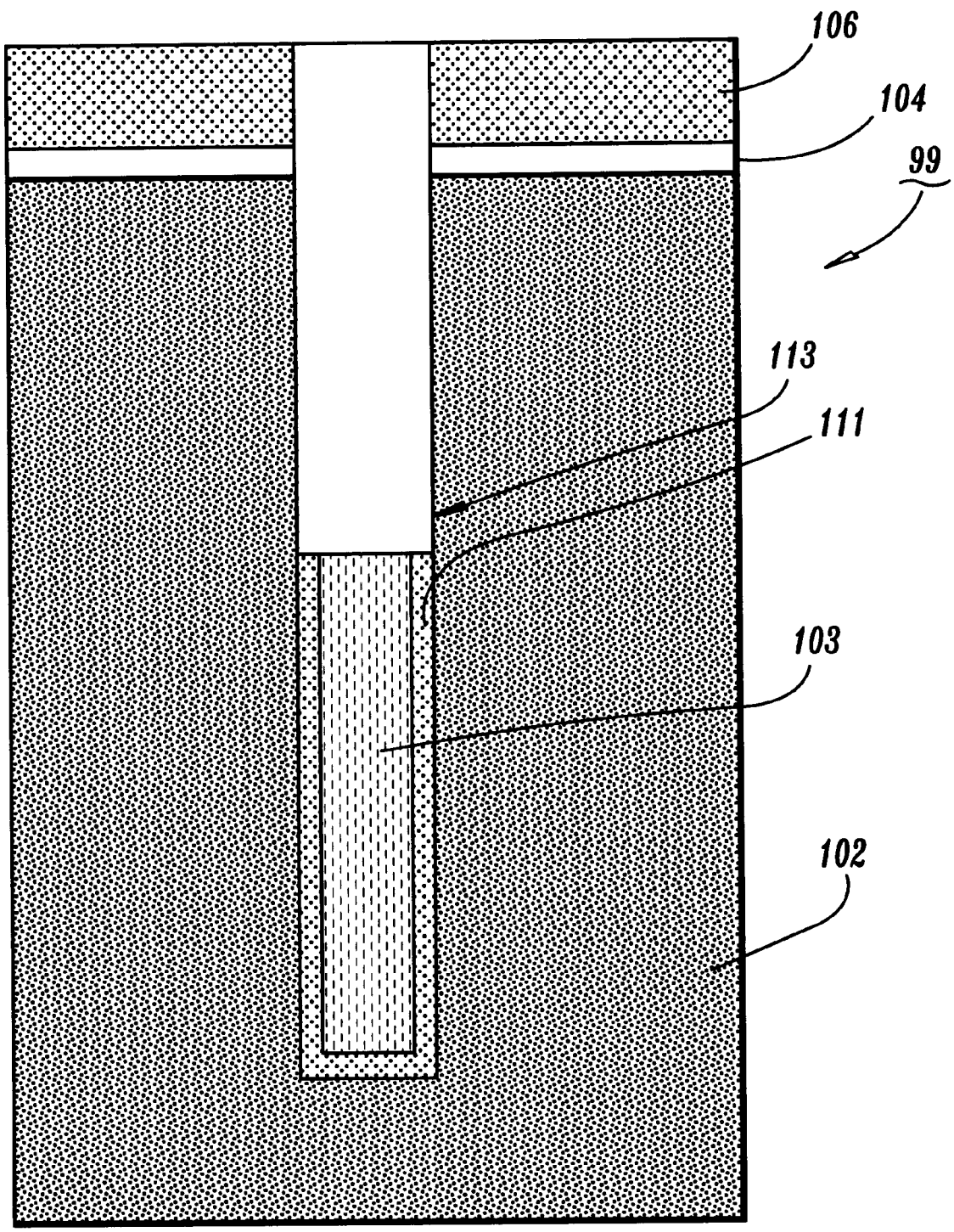
FIG. 2 is a cross-sectional view of the semiconductor device of FIG. 1 showing one method for forming a buried plate in the substrate in accordance with the present invention.

It is to be understood that a buried plate may be formed prior to or after the expansion of the trenches in accordance with the present invention. Referring to FIG. 2, a method for forming buried plate 112 (FIG. 3) before expansion of the trench may be employed. After removing hardmask 108, trench 113 may preferably be lined with arsenic silicate glass (ASG) layer 111 (other dopant sources may be employed as well), serving as a dopant source for forming buried plate 112. A resist layer 103 (or equivalent) may be formed over ASG layer 111 to fill trench 113. Resist layer 103 is etched back and ASG layer 111 is etched such that ASG layer 111 lines trench 113 at a lower portion only. Resist layer 103 is then removed.

Figure 3:
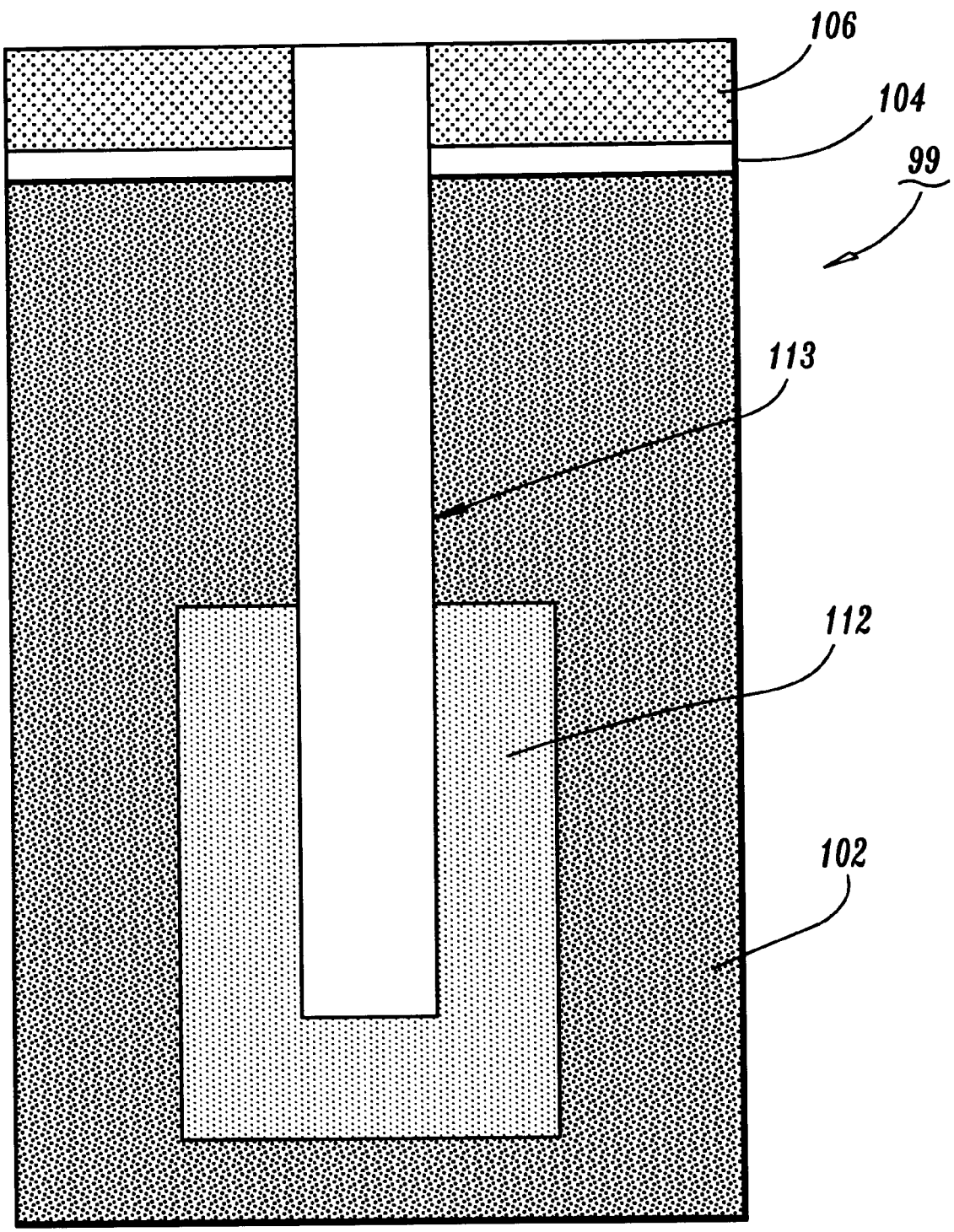
FIG. 3 is a cross-sectional view of the semiconductor device of FIG. 2 showing the buried plate in accordance with the present invention.

Referring to FIG. 3, a buried plate 112 is formed by annealing device 99 to drive dopants into substrate 102 from ASG layer 111. Buried plate 112 functions as one of the two capacitor electrodes employed in a trench capacitor. ASG layer 111 is removed.

Figure 4:
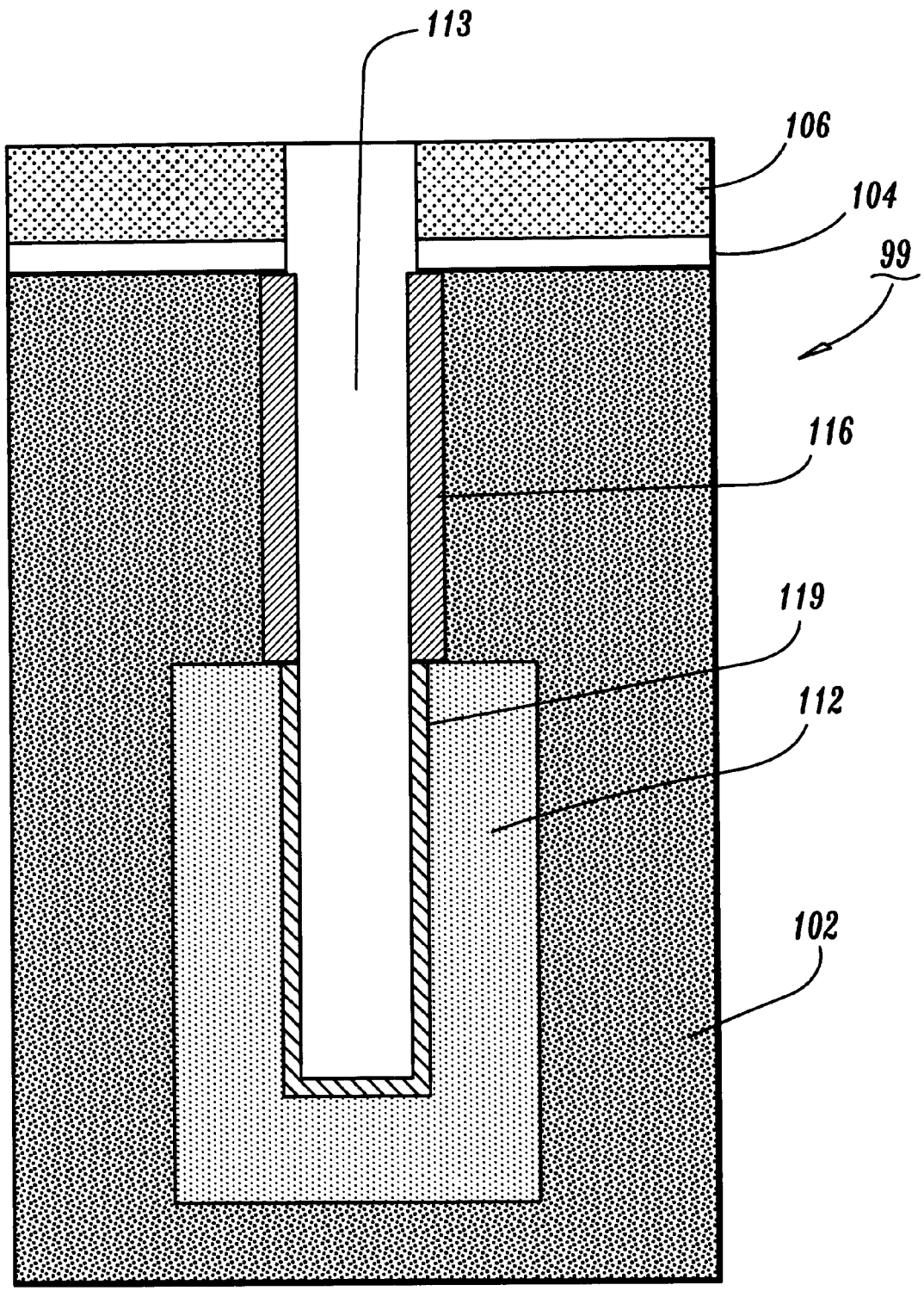
FIG. 4 is a cross-sectional view of the semiconductor device of FIG. 3 showing a collar formed in accordance with the present invention.

Referring to FIG. 4, a nitride layer 119 is deposited to preferably about 50 Å in thickness. A resist material (not shown) is deposited within trench 113 and recessed to mark a location where a collar is to be formed in later steps. Exposed portions of layer 119 are removed, and then the remaining resist material is removed from trench 113. A collar 116 is formed in an upper portion of trench 113. Collar 116 is formed on substrate 102 preferably by performing an oxidation process(for example a local oxidation of silicon (LOCOS)) of the silicon in substrate 102. Layer 119, preferably a nitride, protects lower portions of trench 113 from this oxidation (since nitride acts as a barrier). Other processes may be employed to form collar 116 as well. For example, a TEOS deposition process may be employed. Collar 116 is formed to prevent parasitic leakage currents from discharging the trench capacitor in operation. Remaining portions of layer 119 are removed selective to collar 116. Collar 116 may be annealed to densify the oxide material.

Figure 5:
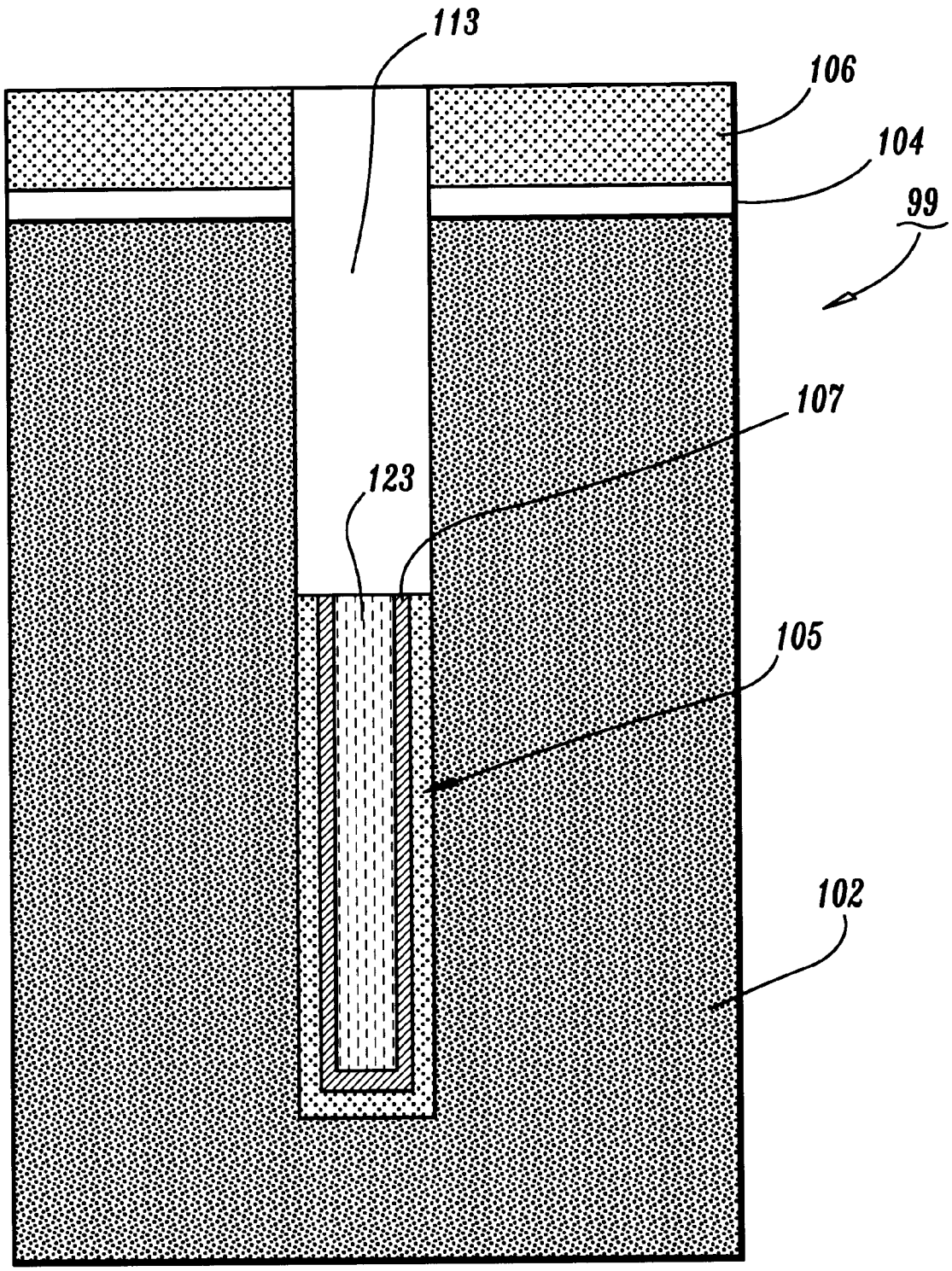
FIG. 5 is a cross-sectional view of the semiconductor device of FIG. 1 showing another method for forming a buried plate in the substrate in accordance with the present invention.
Figure 6:
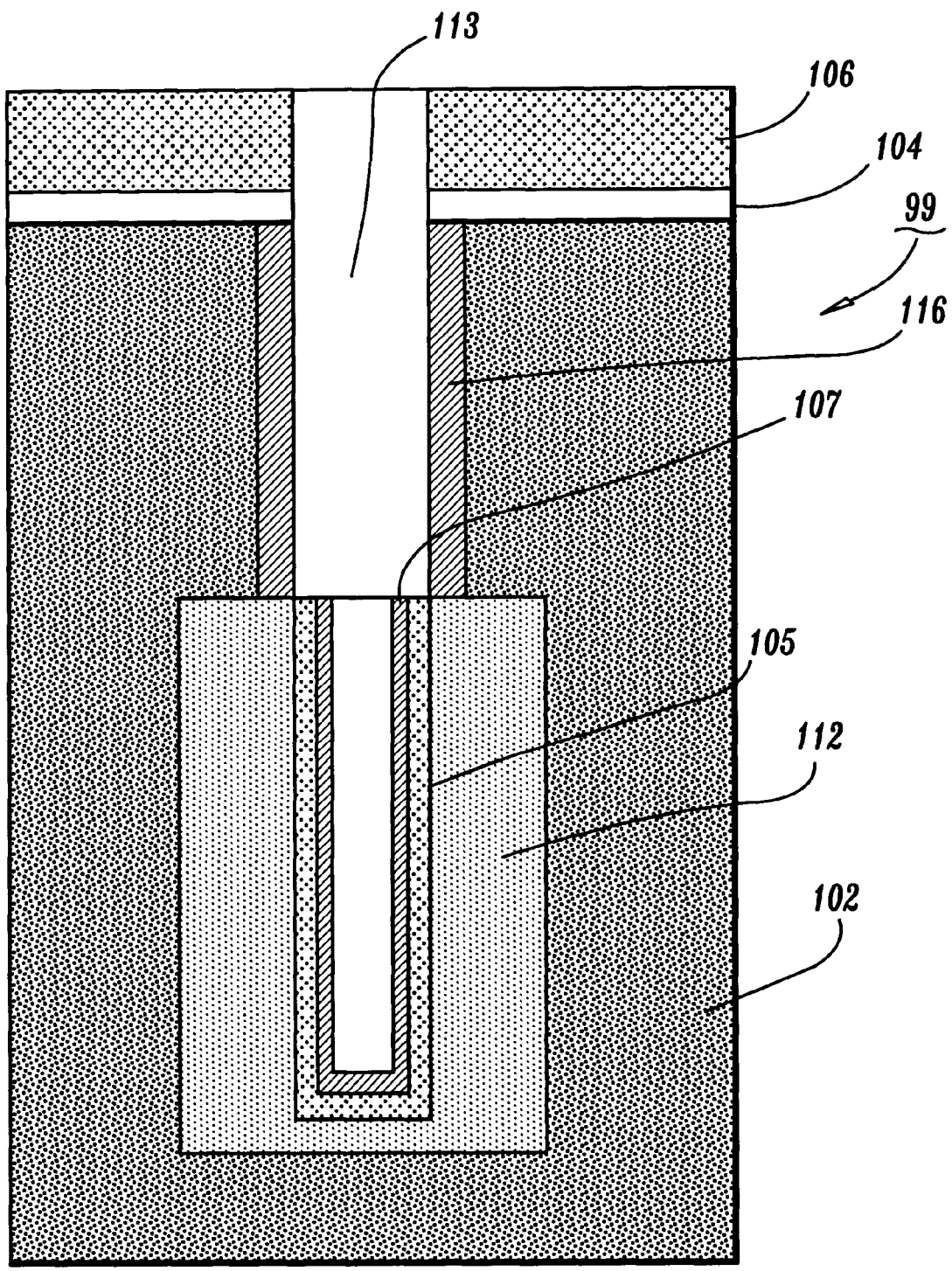
FIG. 6 is a cross-sectional view of the semiconductor device of FIG. 5 showing the buried plate and collar formed in accordance with the present invention.

Referring to FIG. 5, in another embodiment, a self-aligned method for forming buried plate 112 (FIG. 6) prior to expanding the trench may be employed. After removing hardmask 108 (FIG. 1), trench 113 may be lined with an arsenic silicate glass (ASG)/TEOS stack 105, serving as a dopant source for forming buried plate 112 (FIG. 6). The thin TEOS layer(or equivalent) may be formed over the ASG layer (or other dopant source material) to form stack 105. A nitride liner 107 is then deposited, and trench 113 is filled with a resist 123. Resist 123 is etched back to define a lower portion of a collar to be formed in a later step. Stack 105 and layer 107 are removed to the defined lower position where the collar will be formed. Resist 123 is then removed.

Referring to 6, a buried plate 112 and collar 116 are formed by oxidizing device 99 to drive dopants into substrate 102 from ASG of stack 105 to form buried plate 112. Buried plate 112 functions as one of the two capacitor electrodes employed in a trench capacitor. The ASG/TEOS/nitride layer as described in FIG. 5 is formed to line trench 113. The nitride material of layer 107 is formed to protect surfaces of substrate 102 in trench 113 from oxidation during collar formation.

A collar 116 is formed in an upper portion of trench 113. Collar 116 is formed on substrate 102 preferably by performing an oxidation (LOCOS) of the silicon in substrate 102. Layer 107 protects lower portions of trench 113 from this oxidation since nitride acts as a barrier. Other processes may be employed to form collar 116 as well. For example, a TEOS deposition process may be employed. Collar 116 is formed to prevent parasitic leakage currents from discharging the trench capacitor in operation. Remaining portions of stack 105 and layer 107 are removed selective to collar 116. Collar 116 may be annealed to densify the oxide material.

Figure 7:
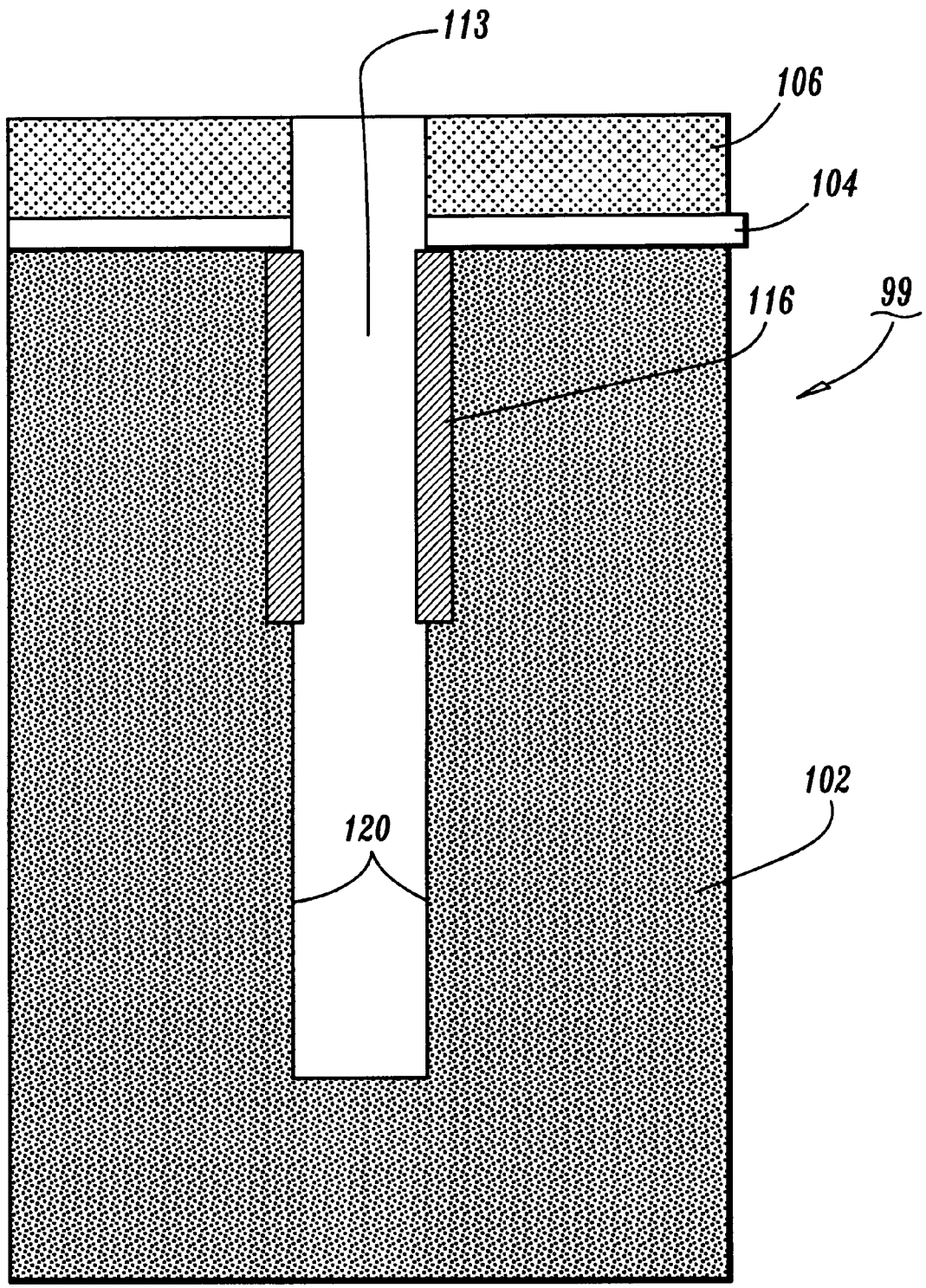
FIG. 7 is a cross-sectional view of the semiconductor device showing a trench before expansion in accordance with the present invention.

Referring to FIG. 7, the two alternative paths (e.g., FIG. 4 and FIG. 6) for forming a buried plate 112 prior to expanding the trench provide the structure of FIG. 7. Collar 116 protects an upper portion of trench 113. The lower portion of trench 113 is now processed in accordance with the invention.

Before patterning trenches 113 in substrate 102, trench orientations were selected relative to crystallographic planes of silicon substrate 102. By selecting the orientation of trenches 113 relative to the crystallographic planes, e.g., (100) and (110), anisotropic wet etching may be performed which provides expansion of the lower portions of trenches 113. Orientations of trenches relative to crystallographic planes will be described in detail hereinbelow.

An anisotropic wet etch process in accordance with the present invention is preferably preceded by a preparation step. The preparation step may employ a wet etch, a dry etch or other process steps capable of removing native oxygen from a surface 120. In a preferred embodiment, the preparation step employs a diluted hydrofluoric (200 to 1) wet etch of surface 120 to prepare surface for further processing. The preparation step may include other processes, such as a HF vapor etch or an $H_2$ bake, for example.

The preparation step creates a hydrogen-terminated surface. By reacting HF with Si, hydrogen atoms remain at surface 120. The HF preparation process is preferably performed for between about 60 seconds to about 180 seconds (for 200:1, parts water to parts HF), however other times and concentrations may be used depending on the design and circumstances. Other preparation processes are contemplated provided a hydrogen terminated silicon surface is provided. The preparation step may be omitted in some embodiments if native oxide is removed in conjunction with other process steps. This preparation step is optional, since the preparation step may be employed simply to give a good starting point for the oxidation which follows.

Figure 8:
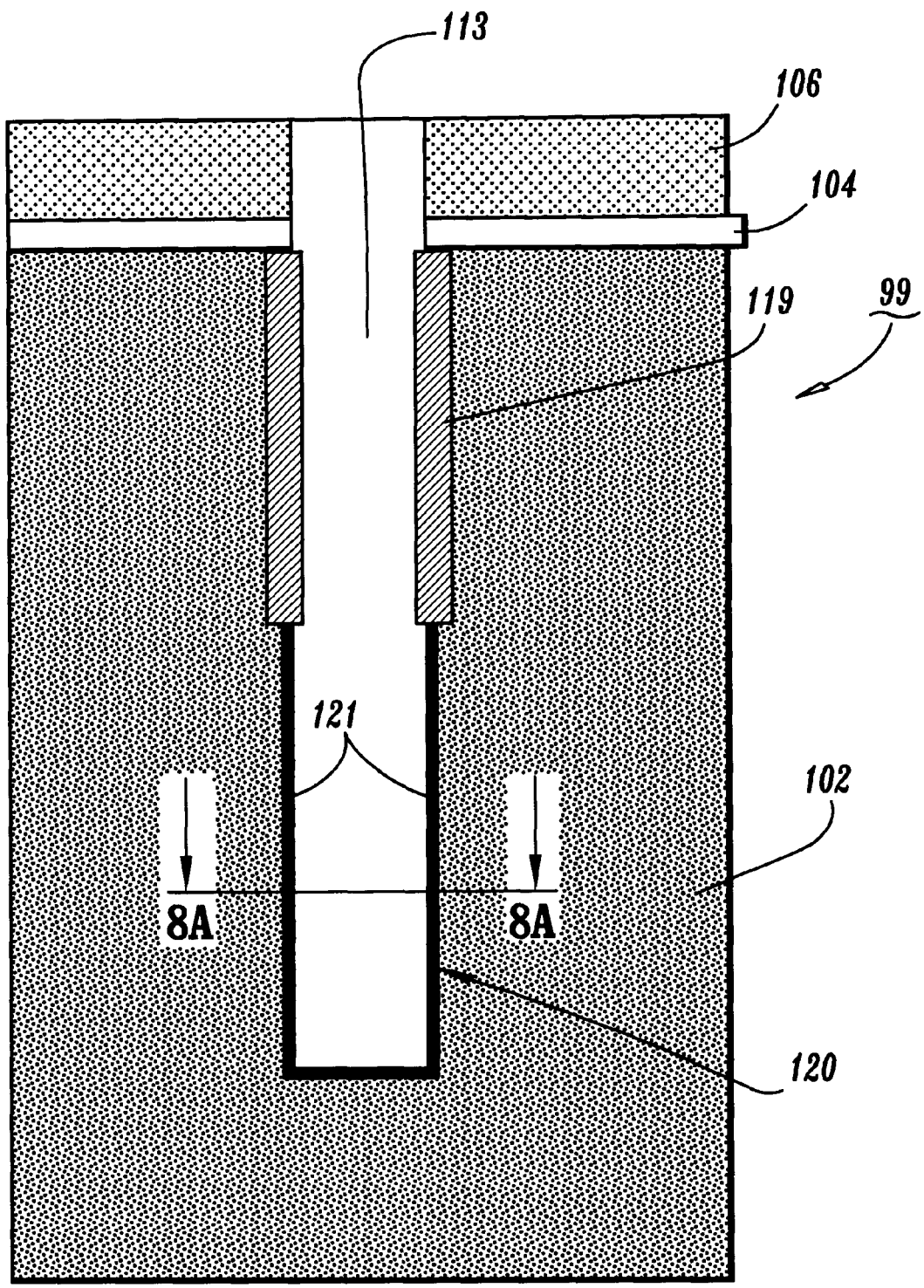
FIG. 8 is a cross-sectional view of the semiconductor device of FIG. 7 showing portions of substrate exposed in the trench oxidized in accordance with the present invention.
Figure 8A:
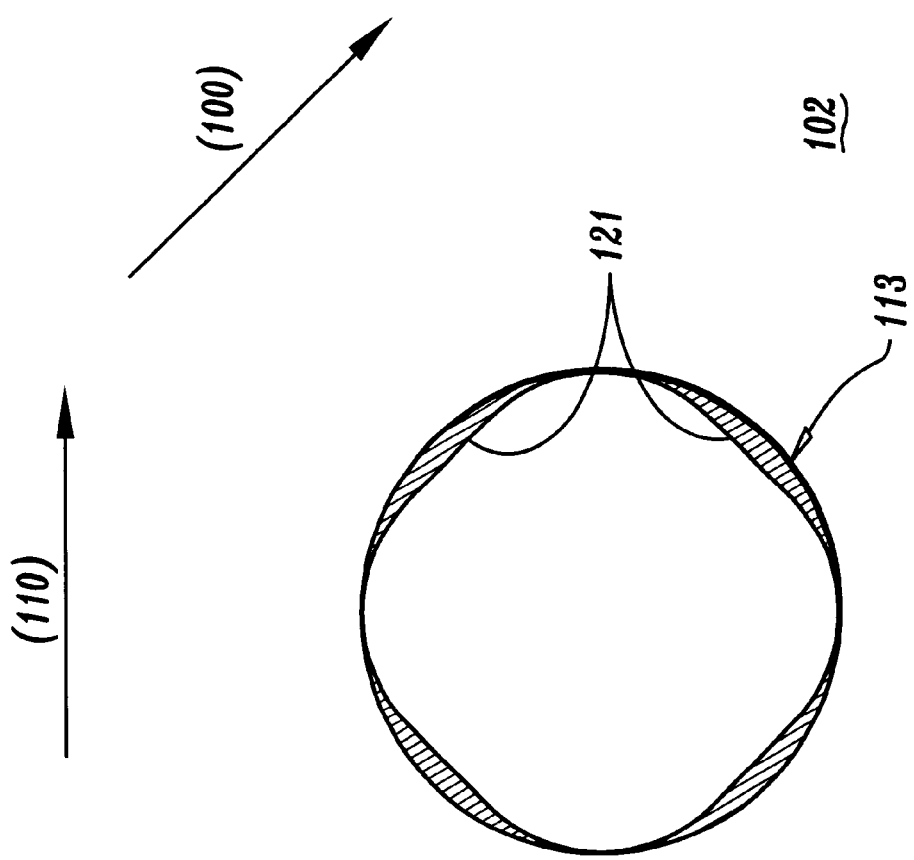
FIG. 8A is a cross-sectional view taken at section line 8A—8A of FIG. 8 showing selective oxide growth on different crystallographic planes in accordance with the present invention.

Referring to FIG. 8, an oxidation process is performed to provide a thin oxide layer 121 over surface 120. Surface 120 includes crystallographic planes (100) and (110), as shown in FIG. 8A. Oxide layer 121 selectively forms on (100) surfaces at a faster rate than (110) surfaces. This means that a thicker oxide forms on (100) surfaces than on (110) surfaces. The orientation of trenches 113 is selected, in accordance with the present invention, to take advantage of selective deposition of oxide layer 121.

Oxide layer 121 is preferably formed by a thermal oxidation process, which provides a thickness which is sufficient to delay etching of silicon on (100) surfaces until the etching on (110) surfaces can catch up.

Referring to FIG. 9, a top down view taken along section line 8A—8A is shown. A wet etch preparation step is preferably performed. The preparation step may employ a wet etch, a dry etch or other process steps capable of removing oxide layer 121 from surface 120. In a preferred embodiment, this includes a diluted hydrofluoric (200 to 1) wet etch of oxide layer 121 to remove oxide layer 121 from surface 120 in the (110) surfaces. This etch process step may include other processes, such as an HF vapor etch or an $H_2$ bake, for example, to reduce the thickness of oxide layer 121.

The preparation step creates a hydrogen-terminated surface on (110) surfaces. By reacting HF with Si, hydrogen atoms remain at surface 120. The HF preparation process is preferably performed with, e.g., 200:1, parts water to parts HF, however other times and concentrations may be used depending on the design and circumstances. Since oxide layer 121 is thicker on (100) surfaces, a thickness of oxide layer 121 remains on (100) surfaces. The remaining oxide thickness on (100) surfaces is customized to provide sufficient etching delay in this crystallographic plane. A thickness of say, X, (where X may be a few nanometers, for example) may be left remaining on the (100) surfaces. This thickness is provided by the oxidation process and by the extent of the preparation wet etch. Other preparation processes are contemplated for reducing the thickness of oxide layer 121.

Figure 10:
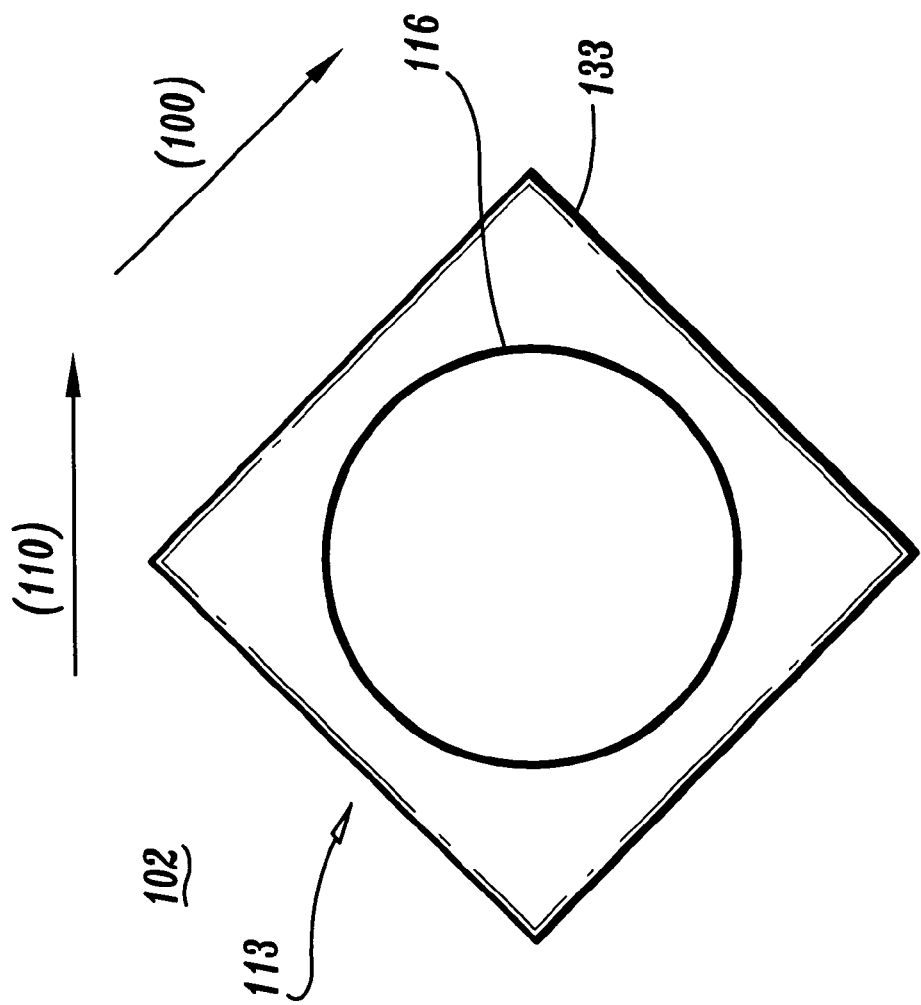
FIG. 10 is a cross-sectional view of the semiconductor device of FIG. 9 showing the trench expanded in a lower portion, an outline of the collar is also shown) in accordance with the present invention.

Referring to FIG. 10, a top down view taken along section line 8A—8A is shown. An anisotropic etch process is now performed to expand lower portions of trench 113. A wet etchant is employed to anisotropically etch away silicon of substrate 102. The wet etchant preferably includes a basic solution. In a preferred embodiment, ammonium hydroxide ($NH_4OH$) is employed as an etchant ($NH_4OH$ may be diluted in water, for example 180 parts water to 1 part $NH_4OH$), although other preferred solutions may include potassium hydroxide or other bases, e.g., solutions with a pH greater than 7). The etching process is more uniform due to the hydrogen-terminated surface created by the preparation step on (110) surfaces. (110) surfaces take longer to etch with solutions, such as, e.g., ammonium hydroxide. In other words, an etching bias exists between crystallographic planes (110) and (100).

(100) surfaces include a selectively deposited oxide layer 121 remaining thereon. Silicon to silicon oxide etching selectivity when etched with ammonium hydroxide is about 1000:1. Therefore, a thinly formed oxide layer 121 (FIG. 9) can be tailored to delay etching of the (100) surfaces. Other materials may be employed for layer 121; however, an oxide is preferred for this application. The thickness, X, of layer 121 on (100) surfaces should account for the etch time needed to remove oxide layer 121 and the etch time needed to etch (100) surfaces the same amount as (110) surfaces. This would provide substantially square-shaped expanded trench portions 133 (as seen from a layout perspective). It should be understood that etching times (and therefore oxide layer thickness) can be tailored to provide different shapes, e.g., rectangular layout shapes, etc. for trenches 113. An outline of a collar 116 is shown for the upper portion of trench 113

The etching is preferably performed at a temperature of between about 10 EC to about 80 EC, although other temperature conditions may be used depending on the circumstances. The wet etching process may be performed for a period of time, which depends on the amount of etching desired, the temperature conditions and the concentration of the etchant. If ammonium hydroxide is employed a selectivity of greater than 1000:1 is also achieved relative to collar 116.

Crystallographic directions of substrate 102 advantageously affect the etching process. In one embodiment, a (100) silicon surface is etched faster than a (110) silicon surface. This is advantageous since the (110) surfaces may be oriented in a direction where expansion of trenches 113 is less desirable, for example, expansion in a direction toward another trench. In addition, lower surface roughness and higher surface planarity are achieved due to the wet etching process. For example, by employing the wet etch process surface planarity is reduced to below 15 nm, and preferably below 4 nm over the depth of a trench (e.g., 6 microns or deeper). Other surface features may benefit from the present invention as well. This is a dramatic improvement over the surface planarity of about 20 nm achieved by conventional RIE processes.

Trenches 113 are positioned to orient the direction of the silicon crystal in accordance with the expansion etch rates most advantageous to the design. Rectangular or square lower portions 133 of trenches 113 are achieved. Also, the etch process of the present invention leaves collar 116 substantially untouched by the etching process. The wet etch process lends itself to inexpensive batch processing with high throughput and employs inexpensive chemistry.

Figure 11:
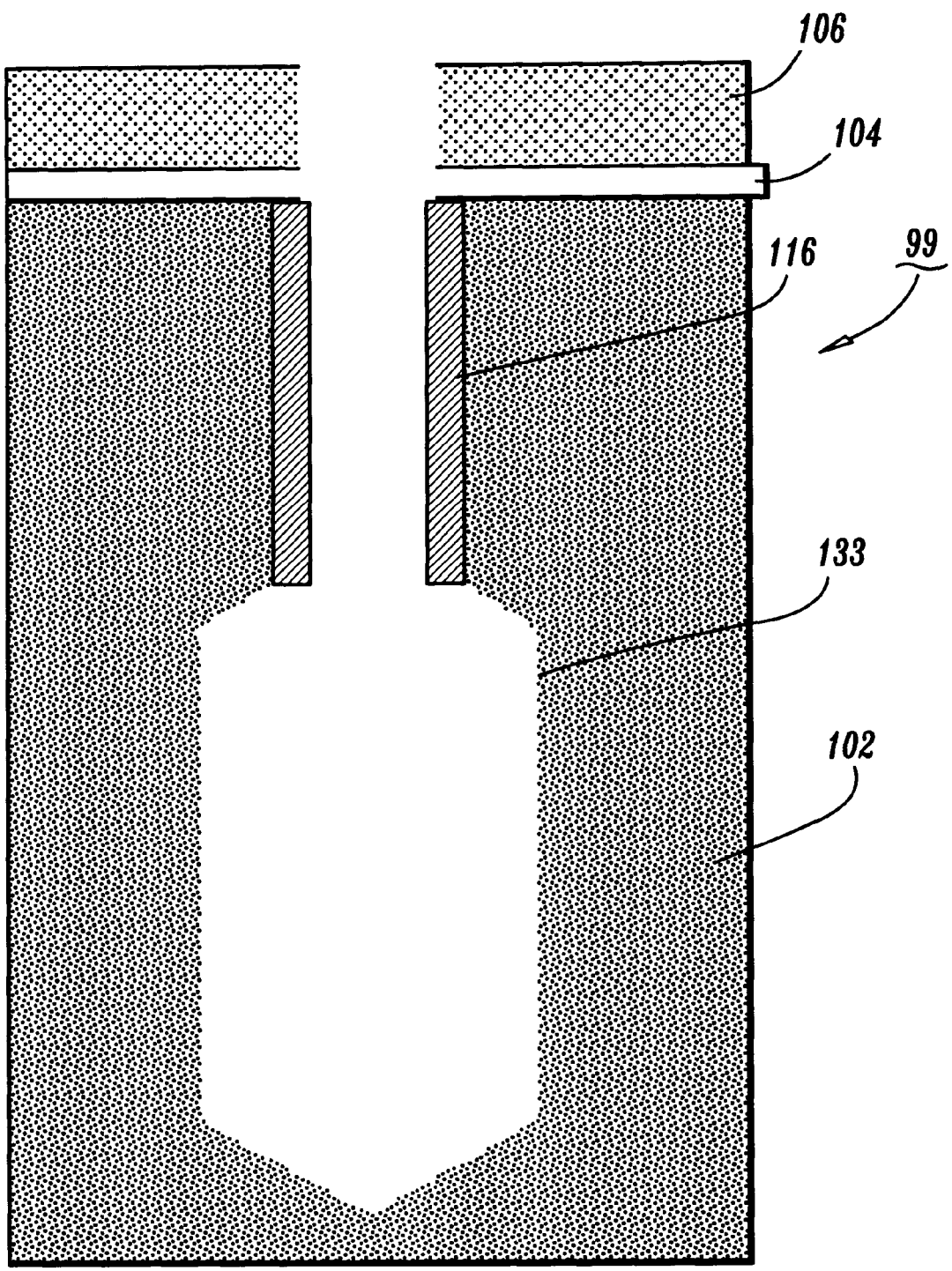
FIG. 11 is a cross-sectional view of the semiconductor device showing the trench expanded in a lower portion in accordance with the present invention.

After expansion of trench 113 as shown in FIG. 11, a nitride dielectric is deposited to line trench 113, a storage node (not shown) is formed within trench 113 using methods known to those skilled in the art. Storage node is preferably formed by depositing polysilicon in trench 113. This may be performed in steps or all in a single process.

Figure 12:
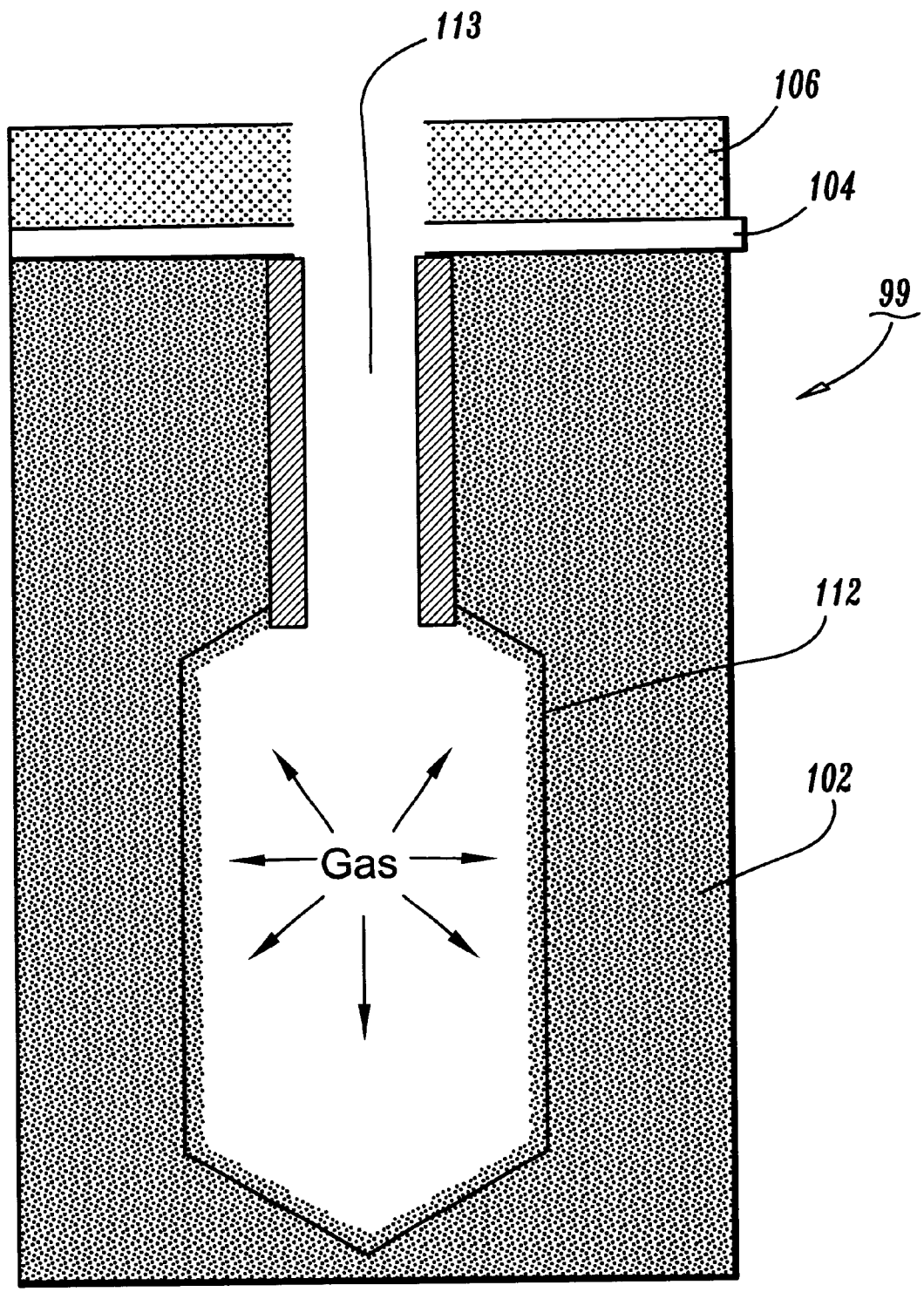
FIG. 12 is a cross-sectional view of the semiconductor device showing another method for forming a buried plate in accordance with the present invention.

Referring to FIG. 12, an alternate method of the present invention forms a buried plate 112 after the anisotropic wet etch process to expand trench 113. Buried plate 112 may be formed by a gas doping process. Gas doping provides dopants in a gaseous form which adsorb onto an exposed surface of substrate 102 and diffuse into substrate 102 to form buried plate 112. Gas doping may include arsenic or other dopants included in a hot gas introduced into trench 113.

After formation of buried plate 112, a nitride dielectric (not shown) is deposited to line trench 113, a storage node (not shown) is formed within trench 113 using methods known to those skilled in the art. Storage node is preferably formed by depositing polysilicon in trench 113.

Referring to FIGS. 13–16, examples of trench orientations formed on semiconductor substrate 102 are provided. Device 99 is formed on substrate 102. Substrate 102 preferably includes a monocrystalline silicon material, and the silicon of wafer 10 includes crystallographic planes. For the illustrative description of the present invention, planes (110) and (100) will be employed. Orientation of trenches 113 is selected in accordance with these crystallographic planes in accordance with the present invention.

In many applications, it is desirable to provide staggered trenches or evenly distributed trenches, e.g., trenches that have a predetermined distance from all adjacent trenches. By employing a selective oxide deposition and an anisotropic wet etch, trenches 113 can be expanded in lower portions 202 selective to a dielectric collar formed in an upper portion of the trench. In addition, the etch rates of (100) surfaces and (110) surfaces can be adjusted to provide a desired expanded shape in the layout.

Figure 13:
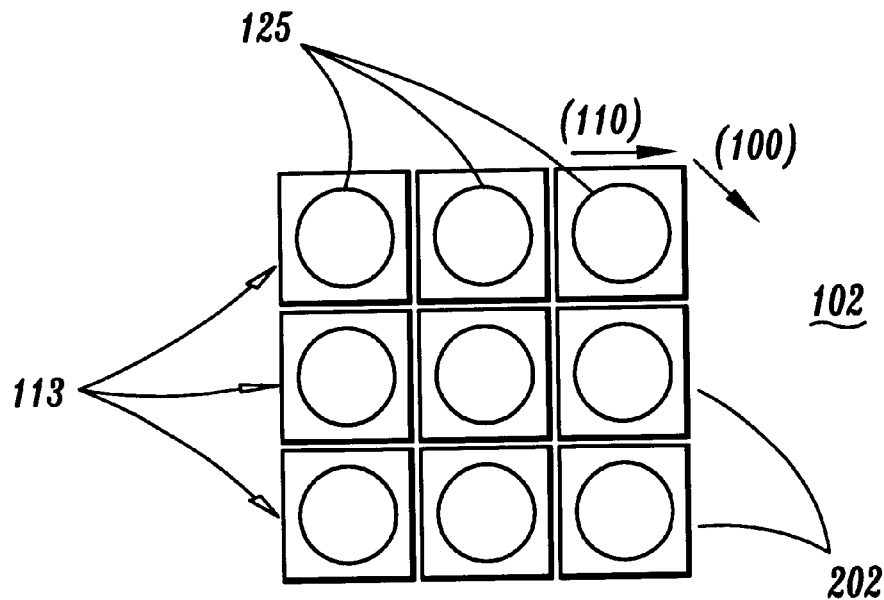
FIG. 13 is a schematic layout of trenches expanded without employing a selectively grown oxide.

As shown in FIG. 13, lower portion 202 may be expanded without the use of oxide layer 121. Growth of lower portions 202 is enhanced in the (100) plane compared with the (110) plane. Upper portions 125 of trenches 113 are separated by an equal distance. Lower portions 202 are expanded by the wet etching of substrate 102. An optimum usage of space is achieved with this positioning of trenches relative to crystallographic orientations.

Figure 14:
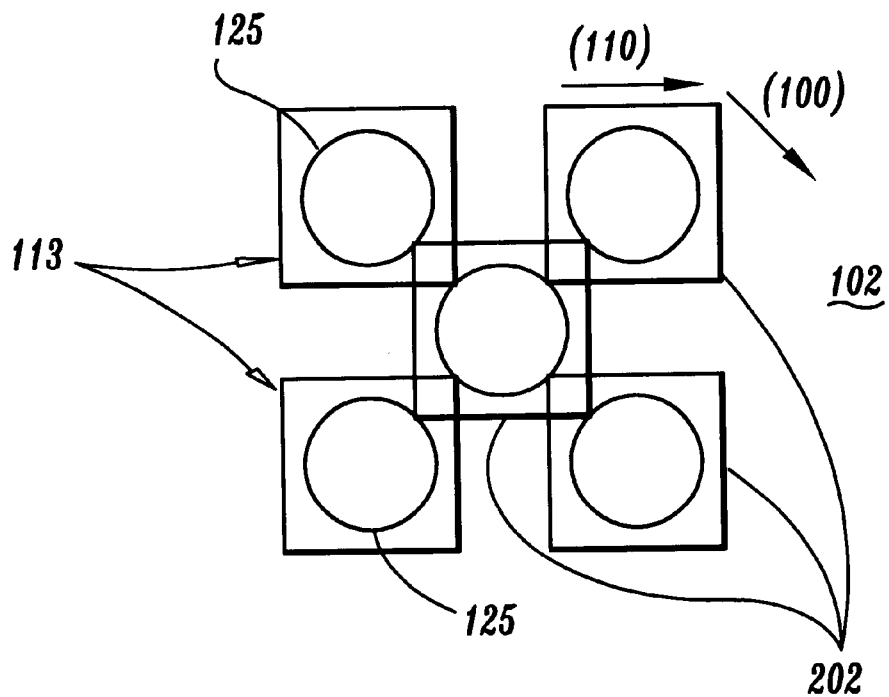
FIG. 14 is a schematic layout of staggered trenches expanded without employing a selectively grown oxide.

In FIG. 14, a configuration of trenches, which may be employed in a semiconductor memory, is shown. The expansion of lower portions 202 of trenches 113 is provided without the use of oxide layer 121. For the crystallographic orientations shown, this results in a merging of portions 202 because of the higher etch rate of the (100) plane. Growth of lower portions 202 is enhanced in the (100) plane compared with the (110) plane. Upper portions 125 of trenches 113 are separated by an equal distance. The overlapping of portions 202 is disadvantageous, and renders the structures useless.

Figure 15:
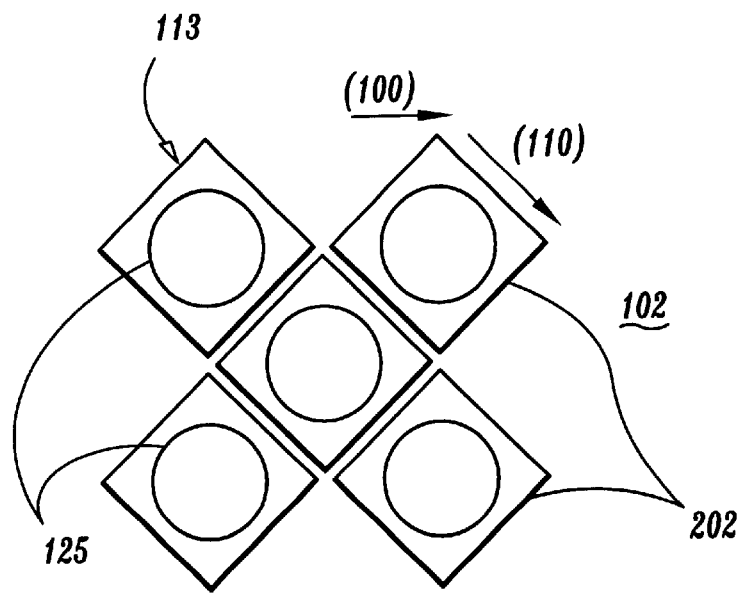
FIG. 15 is a schematic layout of trenches expanded without employing a selectively grown oxide, but rotated 45 degrees from the structure in FIG. 13.

In FIG. 15, a trench configuration is shown which may solve the problems encountered in FIG. 14. The trench configuration includes a 45 degree rotation of the substrate 102. This results in the same layout relative to crystallographic orientation as shown in FIG. 13. Application of such a substrate orientation impacts the device performance of Si surface MOSFET devices and is highly disadvantageous. In addition, the rotation of wafers impacts cleaving of Si chips because of potential cracks parallel to the (110) direction.

Figure 16:
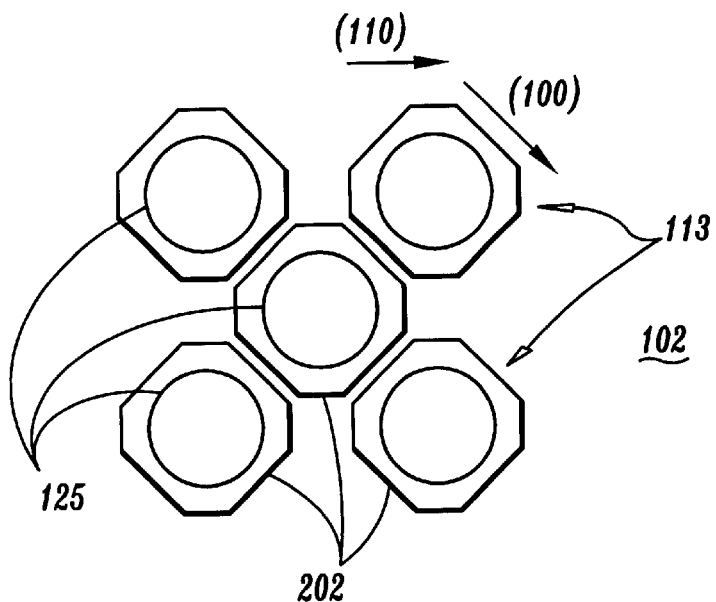
FIG. 16 is a schematic layout of trenches expanded by employing a selectively grown oxide with the same crystal orientation as shown in FIG. 14, in accordance with the present invention.

Referring to FIG. 16, the trench configuration of FIG. 14 may be used by employing the present invention. By employing a silicon oxide layer (e.g. layer 121) in accordance with the present invention, growth of lower portions 202 is inhibited in the (100) plane until growth in the (110) plane can catch up. This results in an inversion of the etch selectivity during the wet etch process to expand portions 202. Instead of the (100) plane being etched faster than the (110) plane, in effect, the (110) plane is etched faster than the (100) plane.

In accordance with the present invention, crystallographic etching selectivity is inverted by employing an oxide layer (e.g., layer 121) so that trenches 113 may be formed to provide sufficient distance between lower portions 202, as shown in FIG. 16. In this way, a staggered deep trench design may be employed without danger of overlapping expanded trenches. A staggered deep trench design (or other trench arrangements) may be employed. This results in an optimized surface area of the trench sidewall as compared to FIG. 14. In addition, Device performance of MOSFET devices is not affected due to undesired crystallographic orientation, and potential crack problems are avoided during the cleaving of chips of the wafer.

Although described in several illustrative embodiments, the present invention is not limited by these examples. Other processes and materials may be used. For example, the insulating collar may be formed using different processes or made from different compounds, e.g., TEOS. Further, the invention is not limited to deep trenches and may be applicable to widening any trenches formed in substrates. Also, HF and $NH_4OH$ may be employed as etchants in different combinations, substituted by other materials or used in combination with other etchants or compounds. The invention provides an anisotropic wet etch to form bottle shaped trenches or widen trenches, with at least the following advantages.

1. High selectivity towards oxide and nitride: no collar thinning.
2. Inexpensive process: wet batch process with high throughput and inexpensive chemistry employed.
3. Higher storage capacitance: square or rectangular shaped trenches are formed, which have higher capacitance than a round or oval shaped trench of the same depth.
4. Lower surface roughness: due to the anisotropic nature of the etching, only one crystallographic orientation is prepared, which gives a very smooth surface and better than 15 nm surface planarity.
5. Higher density trench and memory cells density is achieved due to square-shaped (or rectangular-shaped) expanded trenches.
6. Selective expansion of the trenches without damaging a collar oxide formed in an upper portion of the trench.

Having described preferred embodiments for etch selectivity inversion for etching along crystallographic directions in silicon (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for expanding trenches comprising the steps of:
    forming a trench in a substrate having side walls including at least two crystallographic planes, a first one of the at least two crystallographic planes, a first one of the at least two crystallographic planes being etchable at a faster rate than a second one of the at least two crystallographic planes;
    selectively growing a dielectric layer of surfaces of the at least two crystallographic planes such that the dielectric layer includes a greater thickness on the first one of the at least two crystallographic planes than on the second one of the at least two crytallographic planes; and
    etching the dielectric layer and the substrate such that an etch rate of the second one of the at least two crystallographic planes is effectively etched at a faster rate than the first one of the at least two crystallographic planes, wherein the etching process expands a lower portion of the trench.

2. The method as recited in claim 1, wherein the substrate includes silicon and the first one of the at least two crystallographic planes includes a (100) plane the second one of the at least two crystallographic planes includes a (110) plane, and wherein the step of selectively growing includes selectively growing an oxide on the surfaces.

3. The method as recited in claim 1, wherein the step of etching the dielectric layer and the substrate further comprises the step of preparing surfaces within the trench by removing portions of the dielectric layer by wet etching the dielectric layer to expose portions of the substrate in the trench.

4. The method as recited in claim 3, wherein the step of etching the dielectric layer and the substrate further comprises the step of preparing the exposed portions of the substrate within the trench by etching the surfaces with a wet etchant to provide a hydrogen terminated silicon surface.

5. The method as recited in claim 1, wherein the step of etching the dielectric layer and the substrate includes anisotropically wet etching the surfaces of the substrate to expand the trench.

6. The method as recited in claim 5, wherein the step of anisotropically wet etching includes the step of anisotropically wet etching by employing ammonium hydroxide.

7. The method as recited in claim 5, wherein the step of anisotropically wet etching includes the step of anisotropically wet etching in a batch process.

8. The method as recited in claim 5, wherein the step of anisotropically wet etching includes the step of expanding the trench to form rectangular-shaped trenches.

9. A method for forming expanded deep trenches for semiconductor devices comprising the steps of:
    forming a trench in a substrate having side walls including at least two crystallographic planes, a first one of the at least two crystallographic planes having a first etch rate which is faster than a second etch rate for a second one of the at least two crystallographic planes;
    forming a collar in an upper portion of the trench;
    expanding a lower portion of the trench by:
        selectively growing a dielectric layer on surfaces of the at least two crystallographic planes such that the dielectric layer includes a greater thickness on the first one of the at least two crystallographic planes than on the second one of the at least two crystallographic planes; and
        etching the dielectric layer and the substrate such that an etch rate of the second one of the at least two crystallographic planes is effectively etched at a faster rate than the first one of the at least two crystallographic planes.

10. The method as recited in claim 9, wherein the substrate includes silicon and the first one of the at least two crystallographic planes includes a (100) plane the second one of the at least two crystallographic planes includes a (110) plane, and wherein the step of selectively growing includes selectively growing an oxide on the surfaces.

11. The method as recited in claim 9, wherein the step of etching the dielectric layer and the substrate further comprises the step of preparing surfaces within the trench by removing portions of the dielectric layer by wet etching the dielectric layer to expose portions of the substrate in the trench.

12. The method as recited in claim 11, wherein the step of etching the dielectric layer and the substrate further comprises the step of preparing the exposed portions of the substrate within the trench by etching the surfaces with a wet etchant to provide a hydrogen terminated silicon surface.

13. The method as recited in claim 9, wherein the step of etching the dielectric layer and the substrate includes anisotropically wet etching the surfaces of the substrate to expand the trench.

14. The method as recited in claim 13, wherein the step of anisotropically wet etching includes the step of anisotropically wet etching by employing ammonium hydroxide.

15. The method as recited in claim 13, wherein the step of anisotropically wet etching includes the step of anisotropically wet etching in a batch process.

16. The method as recited in claim 9, wherein the step of anisotropically wet etching includes the step of expanding the trench to form rectangular-shaped trenches.

17. The method as recited in claim 9, further comprising the step of forming a buried plate electrode adjacent to the trench.

18. A method for forming expanded deep trenches for semiconductor devices comprising the steps of:
    forming a trench in a monocrystalline silicon substrate having side walls including at least two crystallographic planes including (100) and (110) planes wherein the (100) plane is etchable at a faster rate than the (110) plane when subjected to an anisotropic wet etch;
    forming an oxide collar in an upper portion of the trench;
    expanding a lower portion of the trench selective to the oxide collar by:
        selectively growing an oxide layer on the (100) and (110) planes such that the oxide layer includes a greater thickness on the (100) plane than on the (110) plane; and
        etching the oxide layer to remove the oxide layer from the (110) plane and form a hydrogen-terminated silicon surface thereon;
        anisotropically wet etching the (100) and (110) planes to expand the lower portion of the trench such that an etch rate of the (110) plane is faster than a combined etch rate of the oxide layer and the (100) plane.

19. The method as recited in claim 18, wherein the step of anisotropically wet etching includes the step of anisotropically wet etching by employing ammonium hydroxide.

20. The method as recited in claim 18, wherein the step of anisotropically wet etching includes the step of anisotropically wet etching in a batch process.

21. The method as recited in claim 18, wherein the step of anisotropically wet etching includes the step of expanding the trench to form rectangular-shaped trenches.

22. The method as recited in claim 18, further comprising the step of forming a buried plate electrode adjacent to the trench.

* * * * *